(12) United States Patent
Iwamizu

(10) Patent No.: US 8,890,581 B2
(45) Date of Patent: Nov. 18, 2014

(54) DRIVING CIRCUIT OF INSULATED GATE DEVICE

(75) Inventor: Morio Iwamizu, Matsumoto (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 270 days.

(21) Appl. No.: 13/193,594

(22) Filed: Jul. 28, 2011

(65) Prior Publication Data

US 2012/0038392 A1    Feb. 16, 2012

(30) Foreign Application Priority Data

Jul. 29, 2010   (JP) ................................ 2010-170376

(51) Int. Cl.
*H03K 3/00*       (2006.01)
*H03K 17/0412*    (2006.01)
*H03K 17/082*     (2006.01)
*H03K 17/08*      (2006.01)

(52) U.S. Cl.
CPC ...... *H03K 17/04123* (2013.01); *H03K 17/0822* (2013.01); *H03K 2017/0806* (2013.01)
USPC ....................................................... 327/109

(58) Field of Classification Search
None
See application file for complete search history.

(56) References Cited

U.S. PATENT DOCUMENTS

| | | | | |
|---|---|---|---|---|
| 6,814,066 B2 * | 11/2004 | Ando | ............................ | 123/644 |
| 2004/0200463 A1 * | 10/2004 | Ando | ............................ | 123/630 |
| 2005/0017788 A1 * | 1/2005 | Inoue | ............................ | 327/432 |
| 2008/0238529 A1 * | 10/2008 | Kumagai | ...................... | 327/512 |
| 2011/0181263 A1 * | 7/2011 | Maruyama | .................... | 323/284 |

FOREIGN PATENT DOCUMENTS

| | | |
|---|---|---|
| JP | 01-300617 | 5/1989 |
| JP | 05-226994 A | 9/1993 |
| JP | 2005-045590 A | 2/2005 |
| JP | 2008-067593 A | 3/2008 |
| JP | 2009-284420 A | 12/2009 |
| WO | WO-2010021082 A1 | 2/2010 |

OTHER PUBLICATIONS

Partial Translation of Japan Office Action dated Sep. 3, 2013.

* cited by examiner

*Primary Examiner* — Lincoln Donovan
*Assistant Examiner* — Khareem E Almo
(74) *Attorney, Agent, or Firm* — Rabin & Berdo, P.C.

(57) ABSTRACT

A driving circuit for driving an insulated gate semiconductor device based on a voltage of an externally-inputted gate signal, where the insulated gate semiconductor device has a source, a drain and a gate, and a parasitic capacitor exists between the drain and the gate. The driving circuit includes a gate voltage controlling semiconductor device disposed between, and connecting, the gate and the source of the insulated gate semiconductor device. The gate voltage controlling semiconductor device has a source and a gate, and is driven by a current charging the parasitic capacitor. The driving circuit also includes a pull-up device disposed between, and connecting, the source and the drain of the gate voltage controlling semiconductor device.

7 Claims, 8 Drawing Sheets

FIG. 2A    FIG. 2B    FIG. 2C
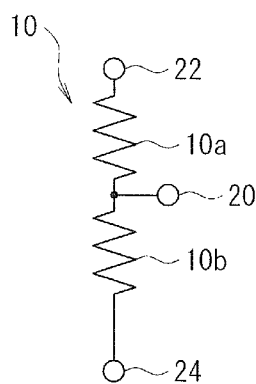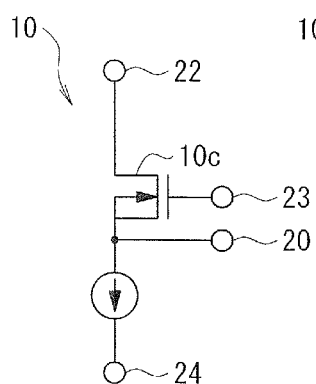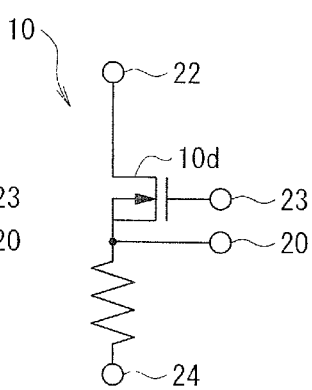
FIG. 3
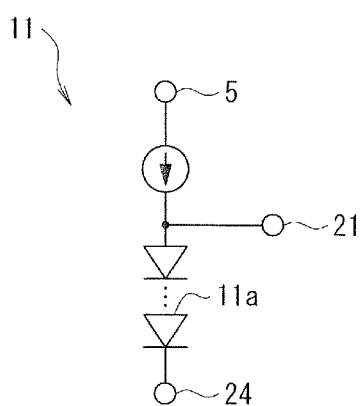

FIG. 4
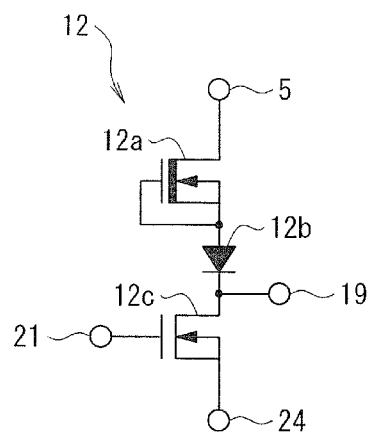
FIG. 5A  FIG. 5B  FIG. 5C
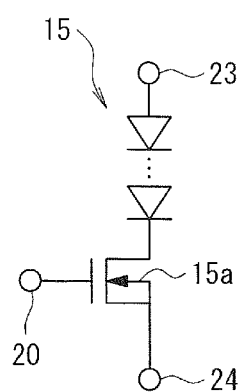 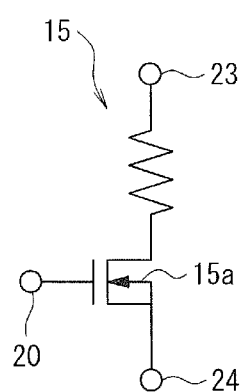 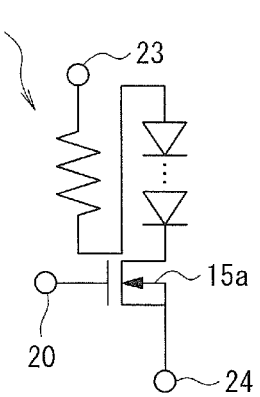

DRIVING CIRCUIT OF INSULATED GATE DEVICE

BACKGROUND OF INVENTION

1. Field of the Invention

The present invention relates to a driving circuit of an insulated gate device, and particularly to a driving circuit of an insulated gate device that prevents faulty turning-on of the device and carries out a high-speed turning-off operation.

2. Background Art

FIG. 11 is a circuit diagram showing a configuration of a related driving circuit of an insulated gate device. As is shown in FIG. 11, one end of a load 102, such as a resistive load or an inductive load, is connected to a power supply 101 and the other end of the load 102 is connected to a load driving control device (high functional Metal Oxide Semiconductor Field Effect Transistor (MOSFET)) 103. The load driving control device 103 is provided with three terminals of a drain terminal 104, a gate terminal 105 and a source terminal 106. The drain terminal 104 is connected to the other end of the load 102 and the source terminal 106 is connected to the ground 107. In addition, to the gate terminal 105, a gate signal is externally inputted. The load driving control device 103 is formed of a driving circuit unit 117 and a power unit 118, which are formed in one semiconductor chip.

The power unit 118 includes a power MOSFET 108 which is an insulated gate device with its turning-on and turning-off controlled by the driving circuit unit 117.

Moreover, the load driving control device 103 has a gate potential line 123 and a ground potential (source potential) line 124. The gate potential line 123 connects the gate terminal 105 and the gate of the power MOSFET 108 through a gate resistor 113. Between the gate potential line 123 and the ground potential (source potential) line 124, there are provided a temperature detecting sensor 111 that detects a temperature, a logic circuit 112 that carries out signal processing of the signal of the temperature detecting sensor 111 and determines a threshold voltage of the load driving control device 103 and a gate voltage controlling MOSFET 114 that controls the shut down the voltage of the gate potential line 123.

Moreover, the drain terminal 104 and the drain of the power MOSFET 108 are connected by a drain potential line 122. Between the drain potential line 122 and the ground potential (source potential) line 124, a current detecting sensor 110 is provided and between the gate potential line 123 and the ground potential (source potential) line 124, a gate voltage control circuit 115 is also provided that controls the voltage level of the gate potential line 123 by receiving a signal of the current detecting sensor 110.

Besides this, between the gate potential line 123 and the ground potential (source potential) line 124, a diode 109 and the gate resistor 113 are provided as protecting devices of the power MOSFET 108. The connection point of the diode 109 and the gate resistor 113 is connected to the gate terminal 105. Furthermore, a constant current source 116 is provided for pulling-down the voltage of the gate potential line 123 so as not to cause the power MOSFET 108 to turn-on even though a noise is inputted to the gate terminal 105.

The load driving control device 103 functions as a switching device for driving the load 102. Moreover, the load driving control device 103, in addition to the switching function, has an overcurrent detecting function for preventing the load driving control device 103 itself from being broken down by a large current flowing in the load driving control device 103 in case such as short circuit of the load 102, an overheating detecting function for preventing the load driving control device 103 itself from being broken down by heat generated due to the large current and a gate protecting function of the switching device. The overcurrent detecting function and the overheating detecting function are operated with the gate voltage used as a power supply voltage.

The overheating detecting function is operated as follows. Namely, with an increase in temperature, when the voltage of the output line 121 of the temperature detecting sensor 111 (the input line to the logic circuit 112) reaches a specified voltage, the logic circuit 112 applies a voltage, which brings a gate voltage controlling MOSFET 114 into a turned-on state, to a gate 119 of the gate voltage controlling MOSFET 114. This makes the voltage of the gate potential line 123 lower than the threshold voltage of the power MOSFET 108 to turn-off the power MOSFET 108 to turn-off the load driving control device 103.

The overcurrent detecting function is operated as follows. Namely, when a voltage of an input line 120 provided from the current detecting sensor 110 to the gate voltage control circuit 115 reaches a specified voltage with an increase in a current flowing between the drain terminal 104 and the ground terminal (source terminal) 106, the gate voltage control circuit 115 restricts a current flowing between the drain terminal 104 and the ground terminal (source terminal) 106 by reducing the voltage of the gate potential line 123.

Moreover, a threshold voltage determination function is also provided by the logic circuit 112 and the gate voltage controlling MOSFET 114. The threshold voltage determination function is a function by which until the threshold voltage of the load driving control device 103 is applied to the gate terminal 105, the gate voltage of the power MOSFET 108 provided by the gate potential line 123 is made to be lower than the threshold voltage of the power MOSFET 108 so that the power MOSFET 108 is not made turned-on.

FIG. 12 is a timing chart showing a threshold voltage determination function. Here, FIG. 12 shows voltage waveforms with respect to a gate voltage Vin of the gate terminal 105, a gate voltage Vg of the power MOSFET 108 (a voltage of the gate potential line 123), a drain voltage Vd of the power MOSFET 108 (a voltage of the drain potential line 122), and a gate voltage Va of the gate voltage controlling MOSFET 114 when a triangular wave voltage is inputted to the gate terminal 105. As shown in FIG. 12, by carrying out the on-off control of the gate voltage controlling MOSFET 114, until the voltage Vin of the gate terminal 105 reaches the threshold voltage VIN(th) of the load driving control device 103, the gate voltage Vg of the power MOSFET 108 is made to be lower than the threshold voltage Vg(th) of the power MOSFET 108. By making the threshold voltage Va(th) of the gate voltage controlling MOSFET 114 and the threshold voltage Vg(th) of the power MOSFET 108 as Va(th)<Vg(th) with variations occurred in the manufacturing process included, the gate voltage Vg of the power MOSFET 108 can be controlled in this way by the driving circuit unit 117 to enable the determination of the threshold voltage VIN(th) of the load driving control device 103.

Incidentally, between the gate and the drain of the power MOSFET 108, a relatively large parasitic capacitor Cgd (not shown) is formed.

Therefore, when switching the state of the power MOSFET 108 from a turned-on state to a turned-off state, the gate voltage Vg is raised by the charging current of the parasitic capacitor Cgd. At this time, with the voltage Vin at the gate terminal 105 being lower than the threshold voltage of the gate voltage controlling MOSFET 114, the gate voltage controlling MOSFET 114 is made turned-off and no charging current is pulled-out by the gate voltage controlling MOSFET 114 to be such a problem as to lengthen the turning-off time.

Thus, for quickly pulling-out the charging current, a measure is generally taken in which a resistor or a constant current source is disposed between the gate of the power MOSFET 108 and the ground potential line 124 or between the gate terminal 105 and the ground potential line 124 to thereby minimize the impedance between the gate of the power MOSFET 108 and the ground potential line 124.

Moreover, as a technique that effectively reduces a surge voltage generated when a power MOSFET is made turned-off and a turn-off loss at this time, there is the technique described in JP-A-2008-675934. According to the technique, a current source circuit and a current adjusting circuit are provided. The current source circuit is a circuit that discharges a gate capacitor when turning-off a current flowing in a main terminal of a power MOSFET and the current adjusting circuit is a circuit that adjusts a value of a current flowing when a gate capacitor is discharged through the current source circuit.

In the technology described in JP-A-2008-675934, the driving circuit is formed so that, when the power MOSFET is turned-off by a gate signal, the current source circuit is connected and, when the power MOSFET is in a state of being turned-on, the current source circuit is disconnected. Here, the output current of the current source circuit is made variable and by the current adjusting circuit, the output current of the current source circuit is made to have a constant value until the voltage across the main terminals of the power MOSFET begins to increase and, with an increase in the voltage across the main terminals, the output current of the current source circuit is made gradually decreased.

As was explained in the foregoing, between the gate and the drain of the power MOSFET 108, the relatively large parasitic capacitor Cgd is formed. This causes, when the voltage of the power supply 101 is promptly increased with the power MOSFET 108 being in a turned-off state, a current Igd charging the parasitic capacitor Cgd to flow. The current Igd flows to the ground 107 through the constant current source 116 and the gate resistor 113. The flow of the current Igd in the constant current source 116 and the gate resistor 113 causes the voltage of the gate potential line 123 to be raised and when the raised voltage exceeds the threshold voltage of the power MOSFET 108, the state of power MOSFET 108 is switched from a turned-off state to a turned-on state. Such a phenomenon remarkably appears particularly when the voltage at the gate terminal 105 is in a state of being lower than the threshold voltage of the gate voltage controlling MOSFET 114 due to the gate voltage controlling MOSFET 114 being in a turned-off state and carrying out no pulling-out of a current.

With the technique described in JP-A-2008-675934, however, no measure is taken against the case in which the power supply voltage is suddenly increased when the power MOSFET is in a turned-off state. Thus, under such a condition, the power MOSFET in a turned-off state is brought into a faulty turned-on state. For preventing such a problem, the value of the output current of the current source circuit must be always kept to be equal to or more than a certain constant current value.

In this case, however, the voltage applied to the gate terminal is pulled-down to cause such problems as a decrease in a conducting ability (increase in an on-resistance $R_{on}$) and an increase in consumed power of the power MOSFET due to a decrease in the gate voltage of the power MOSFET at normal turning-on.

Accordingly, an object of the invention is to provide a driving circuit of an insulated gate device which circuit can actualize prevention of faulty turning-on of the device and high speed turning-off of the device while reducing influences on a normal operation (consumed power and $R_{on}$).

SUMMARY OF THE INVENTION

For solving the above described problems, a first aspect of the invention is a driving circuit of an insulated gate device driving an insulated gate semiconductor device on the basis of an externally inputted gate signal, the driving circuit being characterized by including: a gate voltage controlling semiconductor device connected between a gate and a source of the insulated gate voltage controlling semiconductor device; and a pull-up device connected between a source and a drain of the gate voltage controlling semiconductor device, the gate voltage controlling semiconductor device being driven by a current charging a parasitic capacitor formed between the gate and a drain of the insulated gate semiconductor device.

Thus, in the case in which a power supply voltage is promptly increased when the insulated gate semiconductor device is in a turned-off state, even though the gate voltage of the insulated gate semiconductor device is raised due to a flow of a current charging a parasitic capacitor formed between the gate and the drain of the insulated gate semiconductor device, the pull-up device brings the gate voltage controlling semiconductor device into a turned-on state, by which the charging current can be pulled-out by the gate voltage controlling semiconductor device. This can decrease the gate voltage of the insulated gate semiconductor device, which can prevent the insulated gate semiconductor device from faulty turning-on.

Moreover, also at a turning-off operation, the charging current can be pulled-out by the gate voltage controlling semiconductor device to enable high speed turning-off.

In this way, the gate voltage controlling semiconductor device is driven with the charging current of the parasitic capacitor, formed between the gate and the drain of the insulated gate semiconductor device, taken as a power supply current. Therefore, without depending on an output impedance and the voltage level of the gate signal of an external input circuit applying the gate signal, prevention of faulty turning-on and a high speed turning-off of the insulated gate semiconductor device can be actualized.

Moreover, a second aspect of the invention is characterized in that in the driving circuit of an insulated gate device according to the first aspect of the invention, the pull-up device is a depletion mode MOSFET. This allows the pull-up device to be provided as a constant current source device.

Furthermore, a third aspect of the invention is characterized in that in the driving circuit of an insulated gate device according to the first or second aspect of the invention, the gate voltage controlling semiconductor device can be controlled to be driven so as to be brought into a turned-off state when the voltage value of the gate signal is not less than a specified reference voltage value higher than the threshold voltage of the gate voltage controlling semiconductor device and to be brought into a turned-on state only when the voltage value of the gate signal is below the reference voltage value.

In this way, the gate voltage controlling semiconductor device can be controlled to be driven so as to be brought into a turned-on state only when the voltage value of the gate signal is below the reference voltage value. Hence, the gate voltage controlling semiconductor device can be prevented from being made turned-on when the voltage value of the gate signal is in a state of reaching the reference voltage value. Therefore, influences on a normal operation (faulty turning-off of the insulated gate semiconductor device and increases in power consumption and on-resistance Ron) can be inhibited.

A fourth aspect of the invention is characterized in that in the driving circuit of an insulated gate device according to any one of the first to third aspects of the invention, the driving circuit of an insulated gate device further includes a threshold value control circuit that controls the driving of the gate voltage controlling semiconductor device on the basis of the gate signal, and the threshold value control circuit is provided with a diode that prevents a current from flowing from the pull-up device to a high potential side power supply of the threshold value control circuit.

By providing the threshold value control circuit in this way, until the voltage value of the gate signal reaches the specified reference voltage value, the insulated gate semiconductor device can be kept being turned-off with the gate voltage of the insulated gate semiconductor device made to be lower than the threshold voltage of the insulated gate semiconductor device by the gate voltage controlling semiconductor device, by which a voltage at which the insulated gate semiconductor device is made turned-on can be controlled. Moreover, by providing the diode that prevents a current from flowing from the pull-up device to a high potential side power supply of the threshold value control circuit, the threshold value control circuit can be operated without being affected by the current flowing from the pull-up device.

According to the invention, a circuit configuration is provided which makes a gate voltage controlling semiconductor device turned-on with a current charging a parasitic capacitor formed between the gate and the drain of an insulated gate semiconductor device taken as a power supply current. Thus, without depending on an output impedance of the input circuit applying a voltage to the gate terminal and on a voltage level at turning-off of a signal applied to the gate terminal, the charging current can be quickly pulled-out by the gate voltage controlling semiconductor device. Therefore, prevention of faulty turning-on and high speed turning-off of an insulated gate semiconductor device can be actualized.

Moreover, since the charging current is pulled-out with the gate voltage controlling semiconductor device made turned-on, a chip size can be reduced and, along with this, influences on a normal operation (consumed power and Ron) can be reduced.

BRIEF DESCRIPTION OF THE DRAWINGS

FIG. 2A to 2C are circuit diagrams showing examples of current detecting sensors with configurations different from one another;

FIG. 3 is a circuit diagram showing an example of a configuration of a temperature detecting sensor;

FIG. 4 is a circuit diagram showing an example of a configuration of a logic circuit;

FIG. 5A to 5C are circuit diagrams showing examples of gate voltage control circuits with configurations different from one another;

DESCRIPTION OF THE PREFERRED EMBODIMENT

In the following, an embodiment of the invention will be explained on the basis of the attached drawings.
(Configuration)

Figure 1:
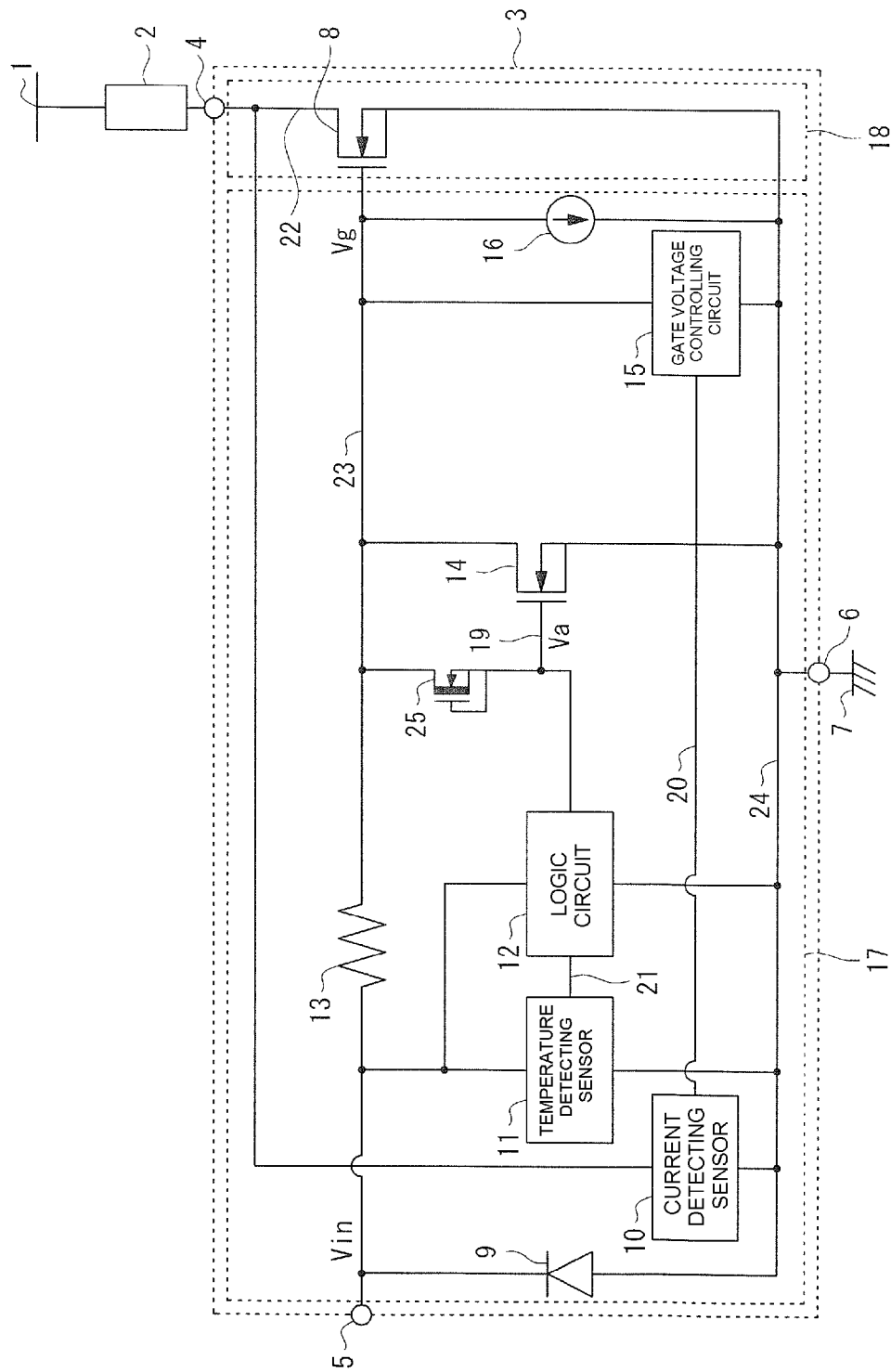
FIG. 1 is a circuit diagram showing the circuit configuration of a semiconductor integrated circuit system to which a driving circuit of an insulated gate device according to the invention is applied.

FIG. 1 is a circuit diagram showing the circuit configuration of a semiconductor integrated circuit system to which a driving circuit of an insulated gate device according to the invention is applied.

As is shown in FIG. 1, one end of a load 2, such as a resistive load or an inductive load, is connected to a power supply 1 and the other end of the load 2 is connected to a load driving control device 3 as a semiconductor integrated circuit system.

The load driving control device 3 is provided with three terminals of a drain terminal 4, a gate terminal 5 and a source terminal 6. The drain terminal 4 is connected to the other end of the load 2 and the source terminal 6 is connected to the ground 7. In addition, to the gate terminal 5, a gate signal is externally inputted. The load driving control device 3 is formed of a driving circuit unit 17 and a power unit 18, which are formed in one semiconductor chip. The power unit 18 includes a power MOSFET (an insulated gate semiconductor device) 8 with its turning-on and -off controlled by the driving circuit unit 17.

Moreover, the load driving control device 3 has a gate potential line 23 with a gate voltage Vg of the gate of the power MOSFET 8 and a ground potential (source potential) line 24 at the ground potential. The gate potential line 23 connects the gate terminal 5 and the gate of the power MOSFET 8 through a gate resistor 13. Between the gate terminal 5 and the ground potential (source potential) line 24, a Zener diode 9 is connected.

Furthermore, the drain terminal 4 and the drain of the power MOSFET 8 are connected by a drain potential line 22. Between the drain potential line 22 and the ground potential (source potential) line 24, a current detecting sensor 10 is connected.

For the current detecting sensor 10, some is provided, for example, as one of those using a series connection of a resistor 10a and a resistor 10b as shown in FIG. 2A, a series connection of a current detecting MOSFET 10c and a constant current source as shown in FIG. 2B, and a series connection of a current detecting MOSFET 10d and a resistor as shown in FIG. 2C. Each of the current detecting sensors 10 is connected between the drain potential line 22 and the ground potential line 24 with a divided voltage, outputted from the connection point of the series connection to a gate voltage control circuit input line 20, used for the current detection.

In addition, between the gate terminal 5 and the ground potential line 24, a temperature detecting sensor 11 is connected. For the temperature detecting sensor 11, a sensor can be used that makes use of temperature dependence of the VF characteristic of a diode 11a shown in FIG. 3, a circuit diagram showing an example of a configuration of the temperature detecting sensor 11.

Between the gate terminal 5 and the ground potential line 24, a logic circuit (threshold voltage control circuit) 12 is connected. For the logic circuit 12, for example, as shown in FIG. 4, a circuit can be used which is formed of an N-type depletion mode MOSFET 12a, a diode 12b and an N-type enhancement mode MOSFET 12c. Here, the diode 12b is provided so that a current flowing in an N-type depletion mode MOSFET 25 to be described later does not flow into the gate terminal 5, as a terminal of a power supply on the higher potential side of the logic circuit (threshold voltage control circuit) 12, through the N-type depletion mode MOSFET 12a.

Moreover, between the gate of the power MOSFET 8 and the gate terminal 5, the gate resistor 13 is connected.

Further, between the gate potential line 23 connected to the gate of the power MOSFET (insulated gate semiconductor device) 8 and the ground potential line 24, a gate voltage controlling MOSFET (gate voltage controlling semiconductor device) 14 is connected. Between the drain and the gate of the gate voltage controlling MOSFET 14, an N-type depletion mode MOSFET 25 is connected as a pull-up device.

Between the gate potential line 23 and the ground potential line 24, a gate voltage control circuit 15 is connected. The input end of the gate voltage control circuit 15 is connected to the output end of the current detecting sensor 10. For the gate voltage control circuit 15, each of circuits with configurations as shown in FIGS. 5A to 5C can be used.

Furthermore, between the gate potential line 23 and the ground potential line 24, a constant current source 16 is connected. The constant current source 16 is provided for pulling-down the voltage of the gate potential line 23 so as not to cause the power MOSFET 8 in a turned-off state to be turned-on even though a noise is inputted to the gate terminal 5. Here, the output current value of the constant current source 16 can be set smaller than the current value required for the related constant current source 116 shown in FIG. 11.

The load driving control device 3, in addition to the function as a switching device for driving the load 2, has an overcurrent detecting and protecting function for preventing the load driving control device 3 itself from being broken down by a large current flowing in the load driving control device 3 in such a case that the load 2 is short-circuited and an overheating detecting and protecting function for preventing the load driving control device 3 itself from being damaged by heat generated by the large current.

The overcurrent detecting and protecting function is actualized by the current detecting sensor 10 and the gate voltage control circuit 15. In the following, a specific explanation will be made with respect to the overcurrent detecting and protecting function.

An overcurrent flowing between the drain terminal 4 and the source terminal 6 causes the output of the current detecting sensor 10, that is, the voltage of the gate voltage control circuit input line 20 to the gate voltage control circuit 15 to increase. With the voltage of the gate voltage control circuit input line 20 to the gate voltage control circuit 15 increased to be equal to or more than a specified voltage, an N-type enhancement mode MOSFET 15a in the gate voltage control circuit 15 shown in each of FIGS. 5A to 5C is made turned-on. This minimizes the voltage of the gate potential line 23 to limit a current flowing between the drain terminal 4 and the source terminal 6.

The overheating detecting and protecting function is actualized by the temperature detecting sensor 11, the logic circuit 12 and the gate voltage controlling MOSFET 14. In the following, a specific explanation will be made with respect to the overheating detecting and protecting function.

With an increase in temperature, the output of the temperature detecting sensor 11, that is, a voltage of an input line 21 to the logic circuit 12 comes to decrease. With the voltage of the input line 21 decreased to be equal to or less than a specified voltage, in the logic circuit 12 with the configuration shown in FIG. 4, the N-type enhancement mode MOSFET 12c is made turned-off, by which a voltage Vin of the terminal 5 is applied to a gate line 19 of the gate voltage controlling MOSFET 14 through the N-type depletion mode MOSFET 12a and the diode 12b. This makes the gate voltage controlling MOSFET 14 turned-on to reduce the voltage of the gate potential line 23 to become lower than the threshold voltage of the power MOSFET 8. In this way, the load driving control device 3 is made turned-off.

The overcurrent detecting and protecting function and the overheating detecting and protecting function require no external power supply and are operated with the voltage of the gate terminal 5 taken as a power supply voltage. This enables the load driving control device 3 in the embodiment to be operated with three terminals like a discrete MOSFET. Moreover, although a gate protecting circuit is externally formed in general, in the embodiment, by forming the gate protecting circuit in the load driving control device 3, no external devices become necessary. As a result, it becomes possible for the load driving control device 3 to reduce its cost and to minimize its occupying area. Furthermore, by mounting each of the detecting circuits and the gate protecting circuit on one chip, reduction in a chip cost and simplification in an assembling process become possible.

In addition, with the logic circuit 12 and the gate voltage controlling MOSFET 14, a threshold voltage determination function is actualized which determines the threshold voltage (reference voltage) VIN(th) of the load driving control device 3. The function is that which keeps the voltage of the gate potential line 23 as the gate voltage Vg of the power MOSFET 8 lower than the threshold voltage Vg(th) of the power MOSFET 8 so as not to make the power MOSFET 8 turned-on until a voltage equal to or more than the threshold voltage VIN(th) is applied to the gate terminal 5.

Figure 12:
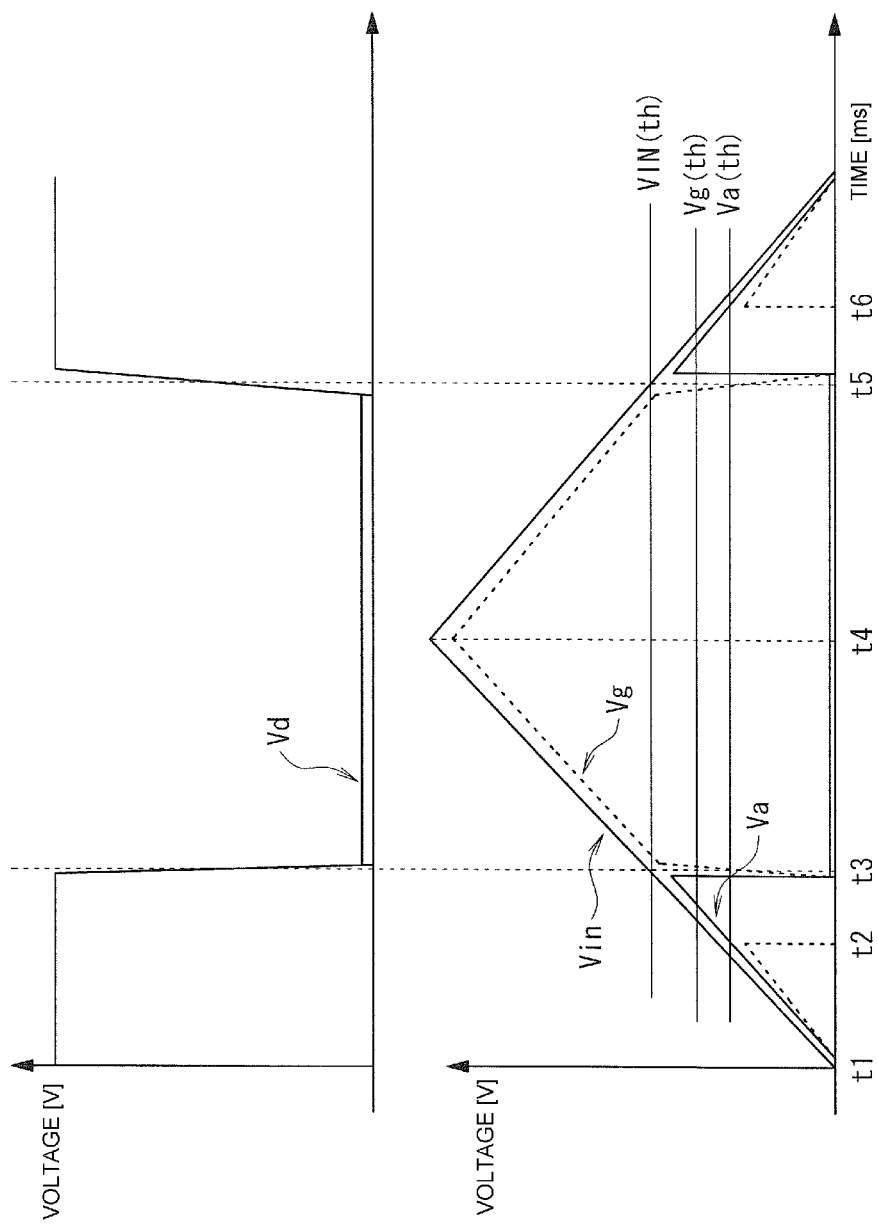
FIG. 12 is a timing chart showing a threshold voltage determination function.

When a triangular wave is inputted as a gate signal to the gate terminal 5, a timing chart showing a threshold voltage determination function becomes as shown in FIG. 12. Namely, with the voltage Vin of the gate signal of the gate terminal 5 started to increase at the time t1, a voltage Va of the output voltage of the logic circuit 12 (the gate voltage of the gate voltage controlling MOSFET 14), with the configuration as shown in FIG. 4, increases with an increase in the voltage Vin of the gate signal of the gate terminal 5. Since the logic circuit 12 uses the voltage Vin of the gate signal of the gate terminal 5 as a power supply voltage, the gate voltage Va of the gate voltage controlling MOSFET 14 comes to be equal to the voltage Vin of the gate signal of the gate terminal 5. The gate voltage controlling MOSFET 14 is made turned-off until the time reaches time t2. Thus, the voltage Vg of the gate potential line 23 to the gate of the power MOSFET 8 is equal to the voltage Vin of the gate terminal 5 (Vg=Vin).

Thereafter, at time t2, with the gate voltage Va of the gate voltage controlling MOSFET 14 reaching the threshold voltage Va(th) of the gate voltage controlling MOSFET 14 lower than the threshold voltage Vg(th) of the power MOSFET 8, the gate voltage controlling MOSFET 14 is made turned-on. Thus, the voltage (Vg) of the gate potential line 23 of the power MOSFET 8 becomes the ground voltage (0V).

Then, at time t3, with the voltage Vin of the gate terminal 5 reaching the threshold voltage VIN(th) of the load driving control device 3, the logic circuit 12 outputs a turning-off signal (Va=Vin) to thereby turn-off the gate voltage controlling MOSFET 14. This makes the voltage Vin of the gate terminal 5 applied to the gate of the power MOSFET 8. In this way, the gate voltage controlling MOSFET 14 comes to be controllable to be in a turned-on state only when the voltage Vin of the gate terminal is below the threshold Vin of the terminal 5.

At the time t3, the voltage Vg of the gate potential line 23 to the gate of the power MOSFET 8 exceeds the threshold voltage Vg(th) of the power MOSFET 8. Thus, at this time, the state of the power MOSFET 8 is switched from a turned-off state to a turned-on state to bring the load driving control device 3 into a turned-on state.

In this way, by making the relation between the threshold value Va(th) of the gate voltage controlling MOSFET 14 and the threshold value Vg(th) of the power MOSFET 8 as Va(th)<Va(th), the voltage of the gate potential line 23 to the gate of the power MOSFET 8 is made to be controllable, by which the threshold voltage VIN(th) of the load driving control device 3 can be determined.

In the embodiment, in a normal operation, the current flowing in the N-type depletion mode MOSFET 25 also flows in the N-type enhancement mode MOSFET 12c in the logic circuit 12. Therefore, with the current taken into consideration, the sizes of the N-type depletion mode MOSFET 12a and the N-type enhancement mode MOSFET 12c in the logic circuit 12 are set so that desired characteristics can be obtained.

(Operation)

Subsequent to this, explanations will be made with respect to the operation of the embodiment.

Suppose that a gate signal is externally inputted to the gate terminal 5 of the load driving control device 3 so as to bring the load driving control device 3 into a turned-on state. At this time, as shown in FIG. 12, suppose that a triangular wave is inputted as a gate signal. Then, by the threshold voltage determination function as was explained in the foregoing, the voltage Vg of the gate potential line 23 is lower than the threshold voltage Vg(th) of the power MOSFET 8 until the voltage Vin of the gate terminal 5 reaches the threshold voltage VIN(th) of the load driving control device 3. Therefore, the power MOSFET 8 keeps the turned-off state until the time t3. Thereafter, at the time t3, with the voltage Vin of the gate 5 reaching the threshold voltage VIN(th), the gate voltage controlling MOSFET 14 is made turned-off to apply the voltage Vin of the gate terminal 5 at this time to the gate of the power MOSFET 8. This makes the power MOSFET 8 turned-on to bring the load driving control device 3 into a turned-on state.

When switching the state of the load driving control device 3 from the turned-on state to a turned-off state, a turning-off signal is inputted to the gate terminal 5 of the load driving control device 3. Namely, after the time t4 in FIG. 12, the voltage Vin of the gate terminal 5 is lowered. Then, accompanied with this, the gate voltage Vg of the power MOSFET 8 is lowered. Then, at the time t5, with the voltage Vin of the gate terminal 5 becoming below the threshold voltage VIN(th), a voltage Vin of the gate terminal 5 at that time is applied to the gate of the gate voltage controlling MOSFET 14. At this time, the voltage Vin of the gate terminal 5 comes to be equal to or higher than the threshold voltage Va(th) of the gate voltage controlling MOSFET 14. This makes the gate voltage controlling MOSFET 14 to be made turned-on at the time t5, by which the gate voltage Vg of the power MOSFET 8 is brought to the ground voltage to make the power MOSFET 8 quickly turned-off, allowing the load driving control device 3 to be brought into a turned-off state.

Thereafter, at the time t6, with the voltage Vin of the gate terminal 5 becoming below the threshold voltage Va(th) of the gate voltage controlling MOSFET 14, the gate voltage controlling MOSFET 14 is made turned-off to allow the voltage Vin of the gate terminal 5 to be applied to the gate of the power MOSFET 8. At this time, the gate voltage Vg of the power MOSFET 8 is below the threshold voltage Vg(th) of the power MOSFET 8 to thereby allow the power MOSFET 8 to keep the turned-off state. From the time t6 on, with a decrease in the voltage Vin of the gate terminal 5, the gate voltage Vg of the power MOSFET 8 also decreases gradually.

In the next, explanations will be made with respect to the case in which the voltage of the power supply 1 promptly increases when the voltage Vin of the terminal 5 is in a state of being lower than the threshold voltage Va(th) of the gate voltage controlling MOSFET 14 and the power MOSFET 8 is in a state of being turned-off. Here, conditions in which the voltage of the power supply 1 promptly increases are given as conditions such as switching in an upstream circuit of the load 2 and rising in the voltage of the power supply 1.

To begin with, explanations will be made with respect to the device structure of the power MOSFET 8.

Figure 6:
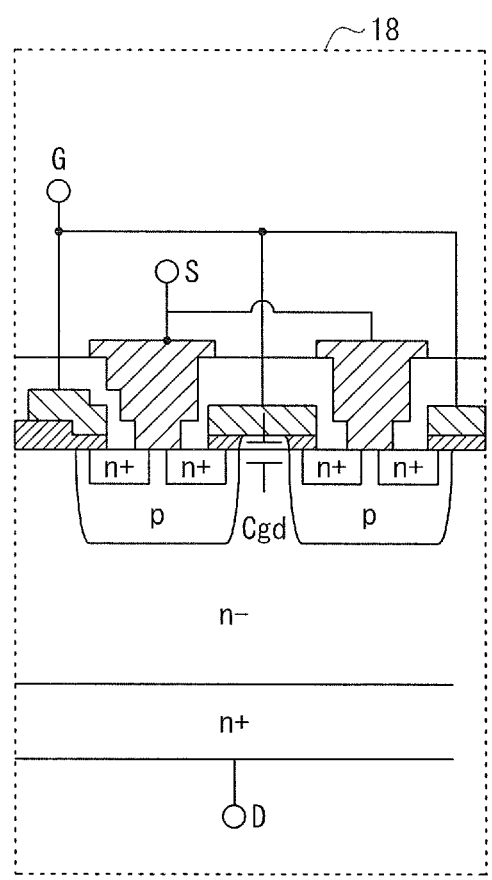
FIG. 6 is a cross sectional view showing a device structure of a power MOSFET formed in a power unit.

FIG. 6 is a cross sectional view showing the device structure of the power MOSFET 8 formed in the power unit 18. A drain terminal, a source terminal and a gate terminal are denoted by reference characters D, S and G, respectively.

As is shown in FIG. 6, the power MOSFET 8 is formed to have a structure in which on the top surface side of an $n^-$ epitaxial layer formed on an $n^+$ substrate, a p-type layer (p-well) with a low impurity concentration and an n-type layer with a high impurity concentration are formed by double diffusion. Between the gate and the drain of the power MOSFET 8, a relatively large parasitic capacitor Cgd is formed.

Figure 7:
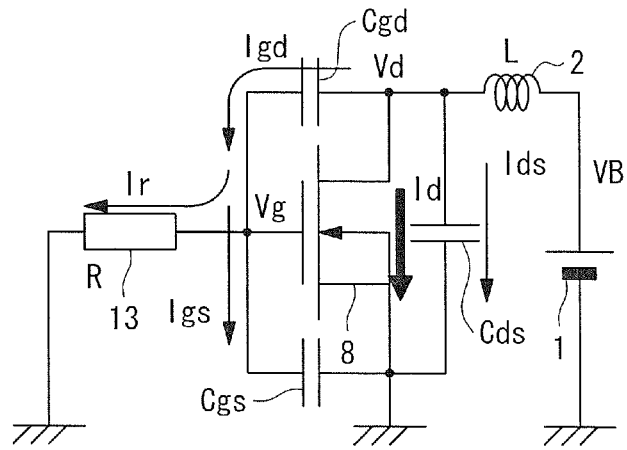
FIG. 7 is a circuit diagram showing the power MOSFET in a simplified model.

FIG. 7 is a circuit diagram showing the power MOSFET 8 in a simplified model. The gate terminal 5 (not shown) is grounded with its voltage Vin made to be at the ground voltage (0V).

Between the gate and the drain of the power MOSFET 8, the parasitic capacitor Cgd is formed, between the drain and the source, a parasitic capacitor Cds is formed and between the gate and the a source, a parasitic capacitor Cgs is formed.

Application of a power supply voltage VB from the power supply 1 to the power MOSFET 8 through the load 2 (inductor L) allows a current Ids charging the parasitic capacitor Cds and a current Igd charging the parasitic capacitor Cgd to flow. A part of the current Igd becomes a current Igs to charge the parasitic capacitor Cgs and a current Ir as the rest of the current Igd flows to the ground as a discharged current through the gate resistor 13 (a discharging resistance R). At this time, the gate voltage Vg of the power MOSFET 8 is equal to the charging voltage of the parasitic capacitor Cgs charged by the current Igs and is also equal to a voltage drop Ir·R across the gate resistor 13 with the discharging resistance R.

Therefore, a prompt increase in the power supply voltage VB when the power MOSFET 8 is in a turned-off state causes the current Igd charging the parasitic capacitor Cgd to flow and a part of the current Igd flows in the gate resistor 13 as the current Ir, by which the gate voltage Vg of the power MOSFET 8 is promptly raised.

Figure 11:
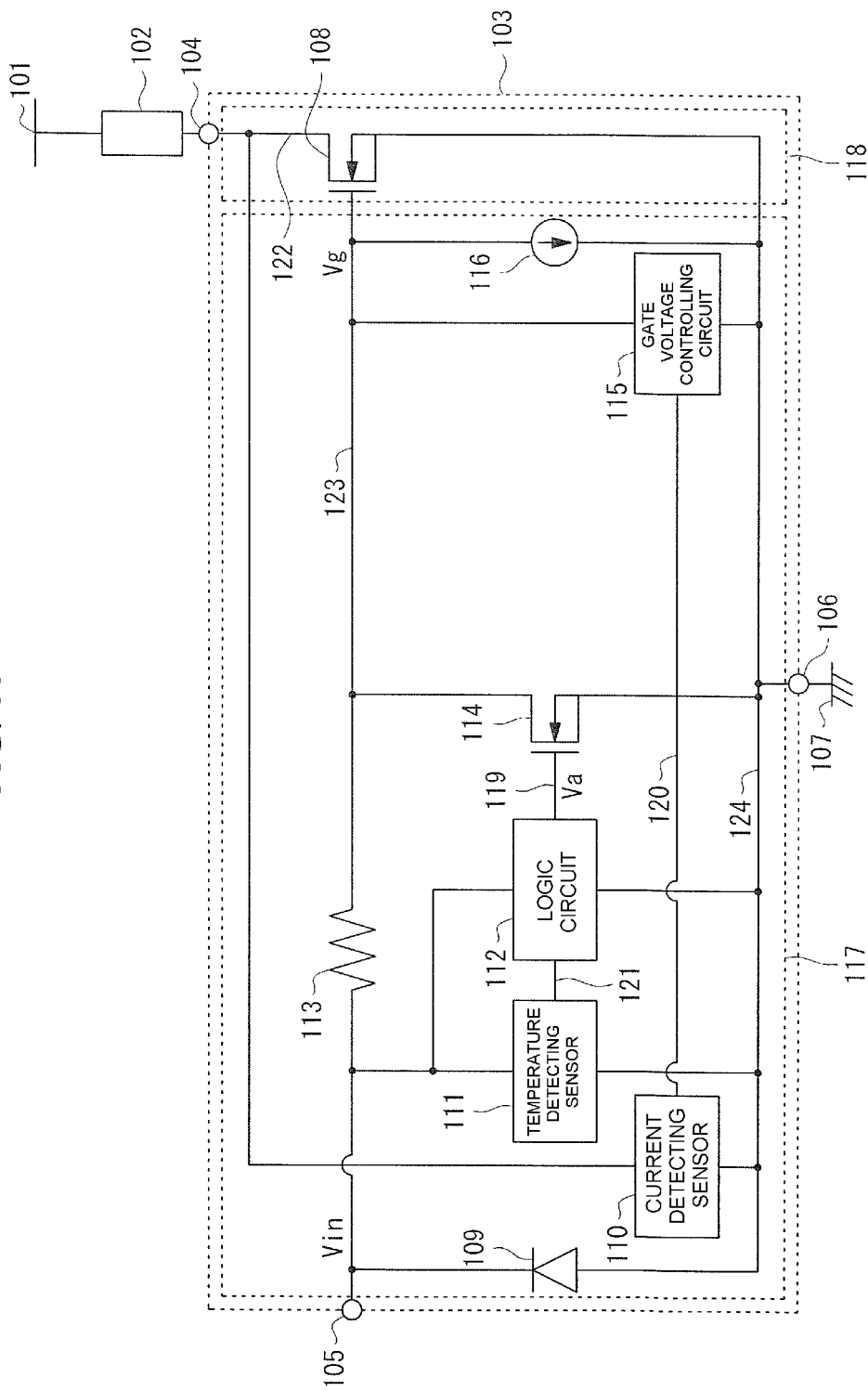
FIG. 11 is a circuit diagram showing a configuration of a related driving circuit of an insulated gate device.

At this time, like in the ordinary load driving control device 103 in the related driving circuit of an insulated gate device shown in FIG. 11, let the gate voltage controlling MOSFET 14 be driven on the basis of only the voltage of the gate terminal 5, namely, let the gate voltage of the gate voltage controlling MOSFET 14 be determined on the basis of only the voltage of the gate terminal 5. Then, when the voltage of the gate terminal 5 is in a state of being below the threshold voltage Va(th) of the gate voltage controlling MOSFET 14, a prompt increase in the power supply voltage VB to raise the gate voltage Vg as was explained above to a voltage equal to or more than the threshold voltage Vg(th) of the power MOSFET 8 causes no pulling-out of the current Ir to be carried out by the gate voltage controlling MOSFET 14. This causes the power MOSFET 8 to be temporarily switched from the turned-off state to a turned-on state.

Figure 8:
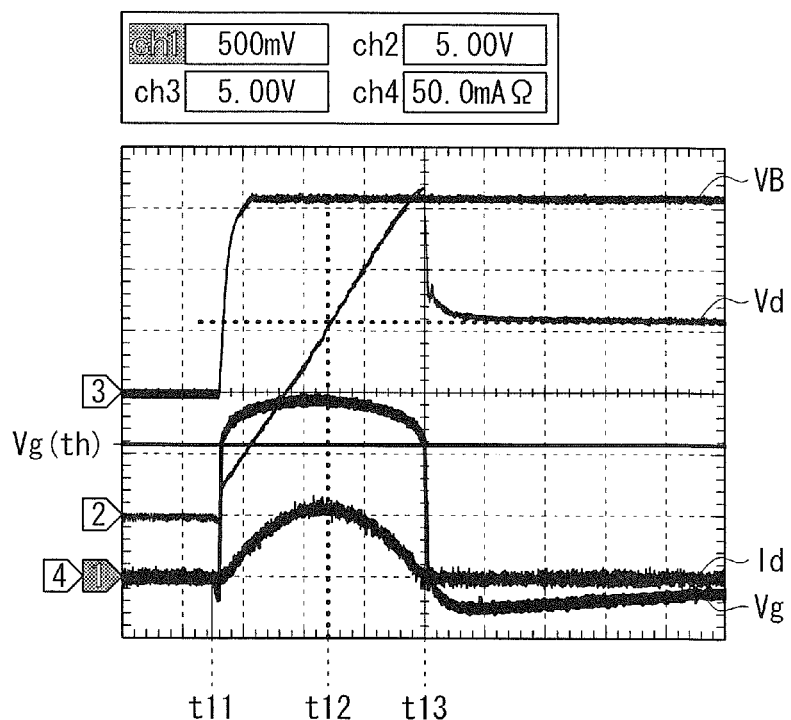
FIG. 8 is a timing chart illustrating a state of a power MOSFET at faulty turning-on in a related driving circuit of an insulated gate device.

FIG. 8 is a timing chart illustrating a state of a related power MOSFET 108 at faulty turning-on in the related driving circuit of an insulated gate device.

Suppose that the power supply voltage VB promptly increases to cause the gate voltage Vg of the power MOSFET 8 to be raised to a voltage equal to or more than the threshold voltage Vg(th) of the power MOSFET 8 at a time t11. Then, at the time t11, the state of the power MOSFET 8 is switched from a turned-off state to a turned-on state.

At this time, in the above described configuration, the charging current flowing in the parasitic capacitor Cgd is constant to thereby linearly increase the voltage across the parasitic capacitor Cgd charged by the constant current. Moreover, a part of the constant charging current flows in the gate resistor 13 to make the gate voltage Vg become approximately constant at the threshold voltage Vg(th) of the power MOSFET 8, by which the drain voltage Vd of the power MOSFET 8 also increases linearly with an increase in the voltage across the parasitic capacitor Cgd (drain voltage Vd=gate voltage Vg+voltage across the parasitic capacitor Cgd).

In a period from the time t11 to the time t12, the drain voltage Vd of the power MOSFET 8 is lower than the power supply voltage VB. In the period in which the voltages Vd and VB are given as Vd<VB, the differentiation of the drain current Id of the power MOSFET 8 with respect to the time t becomes as $d(Id)/dt=(VB-Vd)/L(t12-t11)>0$, by which the drain current Id increases (the inductance of the inductor L as the load 2 is also denoted by L). At the time t12, the voltages Vd and VB come to be given as Vd=VB to result in $d(Id)/dt=0$, by which the drain current Id stops increasing. Thereafter, the voltages Vd and VB come to be given as Vd>VB to result in $d(Id)/dt<0$, by which the drain current Id is made to be reducing. At the time t13, the drain current Id becomes as Id=0, which results in Vd=VB. At this time, the current Igd becomes as Igd=0 to cause the gate voltage to be promptly lowered, by which the power MOSFET 8 returns to a turned-off state.

In this way, a prompt increase in the power supply voltage VB with the voltage of the gate terminal 5 being below the threshold voltage of the gate voltage controlling MOSFET 14 causes the power MOSFET 8 to be temporarily switched from a turned-off state to a turned on state.

Figure 9:
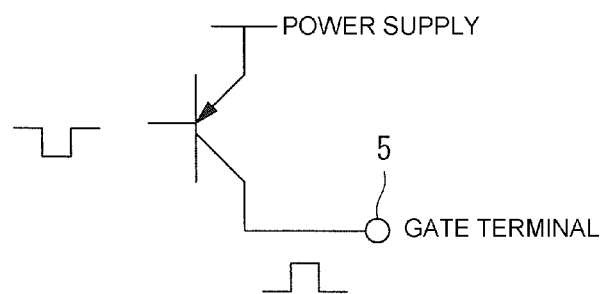
FIG. 9 is a circuit diagram showing a configuration of an input circuit.

Here, explanations were made with respect to the case with the voltage of the gate terminal 5 being lower than the threshold voltage of the gate voltage controlling MOSFET 14. Similar phenomenon, however, will also occur with the gate terminal 5 being connected to the ground 7 through a high impedance device or with the gate terminal 5 being connected to an input circuit having a circuit configuration as shown in FIG. 9.

Figure 10:
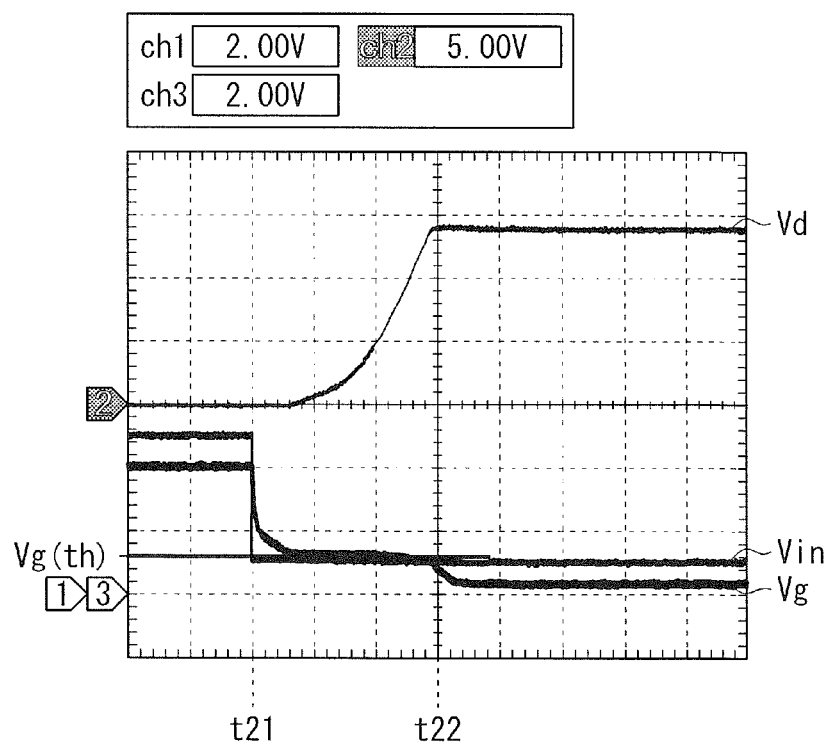
FIG. 10 is a timing chart illustrating a turning-off operation of a power MOSFET in a related driving circuit of an insulated gate device.

Also in a turning-off operation, when the power MOSFET 8 makes a transition from a turned-on state to a turned-off state, by making the gate voltage Vg of the power MOSFET 8 lowered below the threshold voltage Vg(th), the voltage between the gate and the drain of the power MOSFET 8 is increased to cause a current Ir to flow due to charging of the relatively large parasitic capacitor Cgd. This raises the gate voltage Vg in a period from time t21 to time t22 as shown in FIG. 10, a timing chart illustrating the turning-off operation of the power MOSFET 108 in a related driving circuit of an insulated gate device. This, with the voltage of the gate terminal 5 at turning-off being below the threshold voltage Va(th) of the gate voltage controlling MOSFET 14, results in an increase in a turning-off time. In FIG. 10, the position of the reference voltage (0V) of the voltage Vin of the gate terminal 5 is different from that of the gate voltage Vg (the reference voltage of the voltage Vin is shown a little higher).

Compared with this, in the embodiment, the load driving control device 3 is formed to have a configuration so that the gate voltage controlling MOSFET 14 is driven by the current Ir produced due to the presence of the parasitic capacitor Cgd when the drain voltage Vd makes a transition from a low level to a high level, that is, so that the gate voltage of the gate voltage controlling MOSFET 14 is determined also by the current Ir. Therefore, when the voltage of the gate terminal 5 is in a state of being below the threshold voltage of the gate voltage controlling MOSFET 14, a prompt increase in the power supply voltage VB, which raises the gate voltage Vg of the power MOSFET 8 higher than the threshold voltage of the power MOSFET 8, switches the state of the gate voltage controlling MOSFET 14 to a turned-on state in response to the raising.

For example, let the threshold voltage Va(th) of the gate voltage controlling MOSFET 14 be 0.6V and the threshold voltage Vg(th) of the power MOSFET 8 be 1.2V. At this time, like the state at the time t11 in FIG. 8, with the voltage of the gate potential line 23 becoming equal to or more than 0.6V by a prompt increase in the power supply voltage VB, the gate voltage Va of the gate voltage controlling MOSFET 14 is raised to be equal to or more than 0.6V through the N-type depletion mode MOSFET 25. This brings the gate voltage controlling MOSFET 14 into a turned-on state to enable the current Ir due to the presence of the parasitic capacitor Cgd to be quickly pulled-out. As a result, the voltage of the gate potential line 23 can be reduced to be lower than 1.2V of the threshold voltage of the power MOSFET 8, by which the power MOSFET 8 can be prevented from faulty turning-on.

Moreover, in a turning-off operation, the current Ir due to the presence of the parasitic capacitor Cgd can be quickly pulled-out in the same way as above. Thus, a turning-off operation can be carried out at a high speed.

In the embodiment of the load driving control device, a configuration is provided in which a gate voltage controlling MOSFET is provided between the gate and the source of a power MOSFET, an N-type depletion mode MOSFET 25 as a pull-up device is provided between the gate and the drain of the gate voltage controlling MOSFET and the gate voltage controlling MOSFET is driven by a current Ir charging a parasitic capacitor formed between the gate and the drain of the gate voltage controlling MOSFET.

Therefore, even in the case in which a power supply voltage is promptly increased to raise the gate voltage of the power MOSFET when the voltage of a gate terminal is lower than the threshold voltage of the gate voltage controlling MOSFET, that is, when the gate voltage controlling MOSFET is in a turned-off state, the gate voltage controlling MOSFET can be switched into a turned-on state by a current Ir produced at the transition of the drain voltage of the power MOSFET from a low level to a high level. As a result, the gate voltage of the power MOSFET can be lowered to enable the power MOS- FET to be held in a turned-off state. In this way, the power MOSFET can be prevented from a faulty turning-on.

Moreover, also in a turning-off operation of the power MOSFET, like in the foregoing, the current Ir can be pulled-out by the gate voltage controlling MOSFET in the same way as that in the foregoing to enable the power MOSFET to be turned-off at a high speed.

In this way, without depending on the voltage level of a gate signal applied to the gate terminal and the output impedance of an external input circuit applying a voltage to the gate terminal, faulty turning-on of the power MOSFET at a prompt increase in the power supply voltage can be prevented and, along with this, the power MOSFET can be made turned-off at a high speed.

Furthermore, the gate voltage controlling MOSFET is also used for pulling-out the current Ir by turning-on the gate voltage controlling MOSFET without providing any additional external circuit to allow the chip size to be kept small. Along with this, the influences on a normal operation such as an increase in consumed power and deterioration of conduction ability of the power MOSFET (increase in Ron) can be reduced.

In the foregoing embodiment, explanations were made with respect to the case of using the power MOSFET 8 as an insulated gate semiconductor device, but an IGBT (insulated gate bipolar transistor) can be also used.

In addition, in the embodiment, explanations were made with respect to the case of using the N-type depletion mode MOSFETs 12a and 25 as pull-up devices, but resistors can be used instead. As shown in FIG. 1, the use of a depletion mode MOSFET as a pull-up device allows the depletion mode MOSFET to be a constant current source device. This, compared with the case of using a resistor, allows an increase in a current value to be made slight even though the power supply voltage becomes high, but causes the manufacturing processes to be increased. The use of a resistor as a pull-up device can simplify the manufacturing process.

Furthermore, in the embodiment, the constant current source 16 can be omitted.

While the present invention has been particularly shown and described with reference to the preferred embodiments thereof, it will be understood by those skilled in the art that the foregoing and other changes in form and details can be made therein without departing from the spirit and scope of the present invention.

What is claimed is:

1. A driving circuit for driving an insulated gate semiconductor device based on a voltage of an externally-inputted gate signal, the insulated gate semiconductor device having a source, a drain and a gate, a parasitic capacitor existing between the drain and the gate, the driving circuit comprising:
   a gate voltage controlling semiconductor device disposed between, and connecting, the gate and the source of the insulated gate semiconductor device, the gate voltage controlling semiconductor device having a source, a drain and a gate, and being driven by a current that charges the parasitic capacitor; and
   a depletion mode MOSFET (Metal Oxide Semiconductor Field Effect Transistor) disposed between and directly connecting the gate and the drain of the gate voltage controlling semiconductor device, the depletion mode MOSFET being configured to raise a gate voltage of the gate voltage controlling semiconductor device, so as to turn on the gate voltage controlling semiconductor device to pull-out the current at a turning-on operation of the insulated gate semiconductor device.

2. The driving circuit of claim 1, wherein
   the gate voltage controlling semiconductor device has a threshold voltage, and
   the gate voltage controlling semiconductor device enters a turned-off state when the gate signal voltage is equal to or higher than a reference voltage higher than the threshold voltage, and enters a turned-on state only when the gate signal voltage is lower than the reference voltage.

3. The driving circuit of claim 2, further comprising a threshold value control circuit that controls driving of the gate voltage controlling semiconductor device, the threshold value control circuit having a diode disposed between a high-potential side and a low-potential side thereof, to prevent a current from flowing from the depletion mode MOSFET to a power supply on the high-potential side of the threshold value control circuit.

4. The driving circuit of claim 1, wherein
   the gate voltage controlling semiconductor device has a threshold voltage, and
   the gate voltage controlling semiconductor device enters a turned-off state when the gate signal voltage is equal to or higher than a reference voltage higher than the threshold voltage, and enters a turned-on state only when the gate signal voltage is lower than the reference voltage.

5. The driving circuit of claim 4, further comprising a threshold value control circuit that controls driving of the gate voltage controlling semiconductor device, the threshold value control circuit having a diode disposed between a high-potential side and a low-potential side thereof, to prevent a current from flowing from the depletion mode MOSFET to a power supply on the high-potential side of the threshold value control circuit.

6. The driving circuit of claim 1, further comprising a threshold value control circuit that controls driving of the gate voltage controlling semiconductor device, the threshold value control circuit having a diode disposed between a high-potential side and a low-potential side thereof, to prevent a current from flowing from the depletion mode MOSFET to a power supply on the high-potential side of the threshold value control circuit.

7. A driving circuit for driving an insulated gate semiconductor device based on a voltage of an externally-inputted gate signal, the insulated gate semiconductor device having a source, a drain and a gate, a parasitic capacitor existing between the drain and the gate, the driving circuit comprising:
   a gate voltage controlling semiconductor device disposed between, and connecting, the gate and the source of the insulated gate semiconductor device, the gate voltage controlling semiconductor device having a source, a drain and a gate, and being driven by a current that charges the parasitic capacitor; and
   a depletion mode MOSFET (Metal Oxide Semiconductor Field Effect Transistor) disposed between and directly connecting the gate and the drain of the gate voltage controlling semiconductor device, the depletion mode MOSFET being configured to raise a gate voltage of the gate voltage controlling semiconductor device, so as to turn on the gate voltage controlling semiconductor device to pull-out the current at a turning-off operation of the insulated gate semiconductor device.

* * * * *